(12) United States Patent
Zhang

(10) Patent No.: US 12,557,616 B2
(45) Date of Patent: Feb. 17, 2026

(54) METHOD FOR MANUFACTURING SEMICONDUCTOR STRUCTURE WITH ACTIVE AREA HAVING INVERTED TRAPEZOID CROSS-SECTIONAL SHAPE, AND SEMICONDUCTOR STRUCTURE WITH ACTIVE AREA HAVING INVERTED TRAPEZOID CROSS-SECTIONAL SHAPE

(71) Applicant: CHANGXIN MEMORY TECHNOLOGIES, INC., Hefei (CN)

(72) Inventor: Yuanxi Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 443 days.

(21) Appl. No.: 18/166,487

(22) Filed: Feb. 9, 2023

(65) Prior Publication Data

US 2024/0071809 A1 Feb. 29, 2024

(30) Foreign Application Priority Data

Aug. 26, 2022 (CN) .......................... 202211033139.7

(51) Int. Cl.
*H01L 21/762* (2006.01)
*H01L 21/027* (2006.01)
(Continued)

(52) U.S. Cl.
CPC .... *H01L 21/76224* (2013.01); *H01L 21/0276* (2013.01); *H01L 21/0337* (2013.01);
(Continued)

(58) Field of Classification Search
CPC .......... H01L 21/76224; H01L 21/0276; H01L 21/0337; H01L 21/31116; H01L 21/31144;
(Continued)

(56) References Cited

U.S. PATENT DOCUMENTS

2011/0084355 A1* 4/2011 Lin .................... H01L 21/76229
257/E29.02
2014/0099779 A1* 4/2014 Chang ............... H01L 21/02639
438/478
(Continued)

FOREIGN PATENT DOCUMENTS

CN 114256152 A * 3/2022 .......... H10D 64/038
CN 220021123 U * 11/2023

*Primary Examiner* — Ratisha Mehta
*Assistant Examiner* — Sophia W Kao
(74) *Attorney, Agent, or Firm* — Syncoda LLC; Feng Ma

(57) ABSTRACT

A method for manufacturing a semiconductor structure includes operations as follows. A substrate is provided, and a mask layer is formed on the substrate. An etching process is performed to form a plurality of first trenches in the mask layer, where the first trench has an inverted trapezoid cross-sectional shape. An epitaxy layer is formed on the substrate, where the epitaxy layer is filled in each of the first trenches to form an active area. The mask layer is removed to form a plurality of second trenches, where the second trench is arranged between adjacent active areas, and the second trench has a regular trapezoid cross-sectional shape. A dielectric layer is filled in the second trench to form an isolation structure.

10 Claims, 19 Drawing Sheets

(51) Int. Cl.
  *H01L 21/033* (2006.01)
  *H01L 21/311* (2006.01)
  *H10B 12/00* (2023.01)

(52) U.S. Cl.
  CPC .. *H01L 21/31116* (2013.01); *H01L 21/31144* (2013.01); *H10B 12/0335* (2023.02); *H10B 12/05* (2023.02); *H10B 12/315* (2023.02)

(58) Field of Classification Search
  CPC .......... H01L 21/76232; H10B 12/0335; H10B 12/05; H10B 12/315; H10B 12/053; H10D 62/113; H10D 62/124
  See application file for complete search history.

(56) References Cited

U.S. PATENT DOCUMENTS

| | | | |
|---|---|---|---|
| 2015/0155352 A1* | 6/2015 | Chuang | H10D 62/115 |
| | | | 257/506 |
| 2020/0194439 A1* | 6/2020 | Kim | H10B 12/482 |
| 2020/0273863 A1* | 8/2020 | Zhu | H10D 30/62 |
| 2021/0320107 A1* | 10/2021 | Ping | H10B 12/0335 |
| 2022/0336453 A1* | 10/2022 | Ju | H01L 21/76224 |
| 2024/0334674 A1* | 10/2024 | Wang | H10D 84/0158 |

* cited by examiner

METHOD FOR MANUFACTURING SEMICONDUCTOR STRUCTURE WITH ACTIVE AREA HAVING INVERTED TRAPEZOID CROSS-SECTIONAL SHAPE, AND SEMICONDUCTOR STRUCTURE WITH ACTIVE AREA HAVING INVERTED TRAPEZOID CROSS-SECTIONAL SHAPE

CROSS-REFERENCE TO RELATED APPLICATION

The present application claims priority to Chinese Patent Application No. 202211033139.7 filed on Aug. 26, 2022, the disclosure of which is hereby incorporated by reference in its entirety.

BACKGROUND

In a semiconductor structure, such as a Dynamic Random Access Memory (DRAM), a storage cell is generally composed of a transistor structure and a capacitor structure. In an actual operation, a connection between the capacitor structure and the transistor structure may be implemented by a storage node plug.

However, as the integration level of the semiconductor structure increases, the size of the transistor structure decreases. In this case, an area on the transistor structure for contacting the storage node plug also becomes smaller and smaller, which easily results in poor contact between the storage node plug and a transistor.

SUMMARY

The disclosure relates to the field of fabricating a semiconductor, in particular, to a method for fabricating a semiconductor structure, a semiconductor structure, and an isolation structure.

A first aspect of the embodiments of the disclosure provides a method for manufacturing a semiconductor structure. The method includes the following operations.

A substrate is provided.

A mask layer is formed on the substrate.

An etching process is performed to form a plurality of first trenches in the mask layer. The first trench has an inverted trapezoid cross-sectional shape.

An epitaxy layer is formed on the substrate. The epitaxy layer is filled in each of the first trenches to form an active area.

The mask layer is removed to form second trenches. The second trench is arranged between adjacent active areas. The second trench has a regular trapezoid cross-sectional shape.

A dielectric layer is filled in the second trench to form an isolation structure.

A second aspect of the embodiments of the disclosure further provides a semiconductor structure. The semiconductor structure includes: a substrate; a plurality of active areas and a plurality of second trenches on the substrate, the plurality of second trenches defining the plurality of active areas; and an isolation structure arranged in each of the second trenches. Each of the active areas has an inverted trapezoid cross-sectional shape, and each of the isolation structures has a regular trapezoid cross-sectional shape.

The details of one or more embodiments of the disclosure are set forth in the drawings and the description below. Other features and advantages of the disclosure will be apparent from the drawings and the claims from the specification.

BRIEF DESCRIPTION OF THE DRAWINGS

In order to more clearly illustrate the technical solutions in the embodiments of the disclosure, the drawings used in the embodiments will be briefly described below. It is apparent that the drawings in the following descriptions merely show some embodiments of the disclosure. Other drawings can be obtained for those skilled in the art according to these drawings without any creative work.

DETAILED DESCRIPTION

Figure 1:
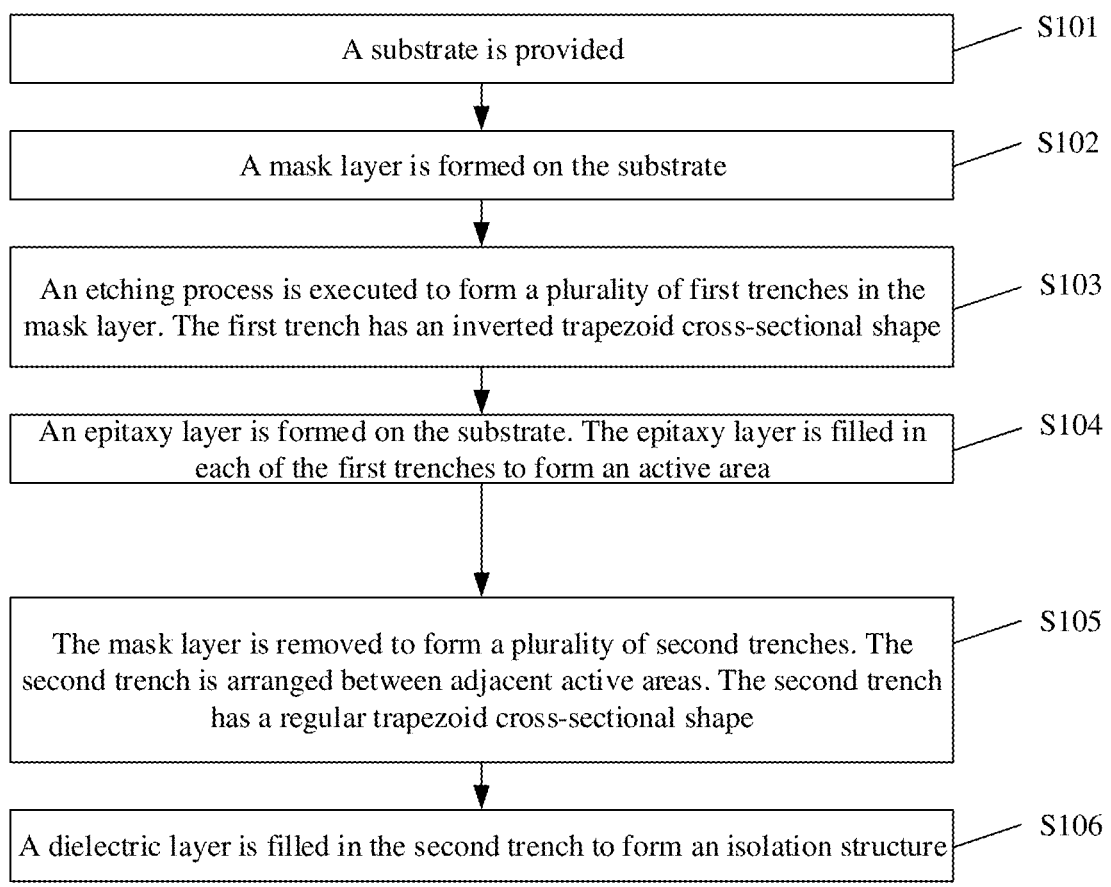
FIG. 1 is a block flowchart of a method for manufacturing a semiconductor structure according to an embodiment of the disclosure.

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for comprehensively understanding the disclosure, and to fully convey a scope disclosed in the embodiments of the disclosure to a person skilled in the art.

In the following descriptions, a lot of specific details are given in order to provide the comprehensive understanding of the disclosure. However, it is apparent to a person skilled in the art that the disclosure may be implemented without one or more of these details. In other examples, in order to avoid confusion with the disclosure, some technical features well-known in the field are not described. Namely, all the features of the actual embodiments are not described here, and well-known functions and structures are not described in detail.

In the drawings, the sizes of a layer, a region, and an element and their relative sizes may be exaggerated for clarity. The same reference numeral represents the same element throughout.

It should be understood that while the element or the layer is referred to being "on", "adjacent to", "connected to" or "coupled to" other elements or layers, the element or layer may be directly on the other elements or layers, adjacent to, connected or coupled to the other elements or layers, or an intermediate element or layer may exist between the element and layer and the other elements and layers. In contrast, while the element is referred to as being "directly on", "directly adjacent to", "directly connected to" or "directly coupled to" other elements or layers, there is no intermediate element or layer between the element and layer and the other elements and layers. It should be understood that although terms first, second, third and the like may be used to describe various elements, components, regions, layers and/or portions, these elements, components, regions, layers and/or portions should not be limited by these terms. These terms are only used to distinguish one element, component, region, layer or portion from another element, component, region, layer or portion. Therefore, without departing from the teaching of the disclosure, a first element, component, region, layer or portion discussed below may be represented as a second element, component, region, layer or portion. While the second element, component, region, layer or portion is discussed, it does not mean that the first element, component, region, layer or portion exists necessarily in the disclosure.

Spatial relation terms, such as "under", "below", "lower", "underneath", "on", "upper" and the like, may be used here for conveniently describing, so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates another mode. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

In a semiconductor structure, an active area is an important component. In an actual operation, a transistor structure may be obtained by processes of forming a channel area, a gate and a source/drain region on the active area. After the above process operations, a storage node plug is generally formed on the source/drain region of the transistor structure, to achieve a connection between a capacitor structure and the transistor structure.

However, as the size of the semiconductor structure decreases, the size of the active area decreases, which easily results in poor contact between the active area and the storage node plug caused by relatively-small contact area when the storage node plug is formed on the active area subsequently, and thus easily causes the reduction of the performance of the semiconductor structure, even device failure.

Based on this, the following technical solutions of the embodiments of the disclosure are provided.

An embodiment of the disclosure provides a method for manufacturing a semiconductor structure. As shown in FIG. 1, the method includes the following operations.

At S101, a substrate is provided.

At S102, a mask layer is formed on the substrate.

At S103, an etching process is performed to form a plurality of first trenches in the mask layer. The first trench has an inverted trapezoid cross-sectional shape.

At S104, an epitaxy layer is formed on the substrate. The epitaxy layer is filled in each of the first trenches to form an active area.

At S105, the mask layer is removed to form second trenches. The second trench is arranged between the adjacent active areas. The second trench has a regular trapezoid cross-sectional shape.

At S106, a dielectric layer is filled in the second trenches to form an isolation structure.

In the disclosure, the trapezoid is used to define a shape having unequal top side and bottom side, and the trapezoid may be a strict trapezoid or an approximate trapezoid. The inverted trapezoid has a wide top side and a narrow bottom side, and the regular trapezoid has a narrow top side and a wide bottom side.

In the embodiments of the disclosure, after the trench having the inverted trapezoid cross-sectional shape is obtained by etching the mask layer, the active area having a large upper portion may be obtained by forming the epitaxy layer in the trench. The active area may well accommodate a structure to be formed subsequently and may be in good contact with the structure. In addition, after the active area is formed, the mask layer is removed and the isolation structure is formed, and a desirable contact interface can be obtained in a position that the active area is in contact with the isolation structure, so as to enhance an isolation effect, thereby improving the performance of the semiconductor structure.

In order to make the above purposes, features and advantages of the disclosure more obvious and easy to understand, specific implementations of the disclosure are described below in detail with reference to the drawings. While the embodiments of the disclosure are described in detail, for ease of descriptions, a schematic diagram may be partially enlarged according to a non-general scale, and the schematic diagram is only an example, and should not limit a scope of protection of the disclosure herein.

Figure 2:
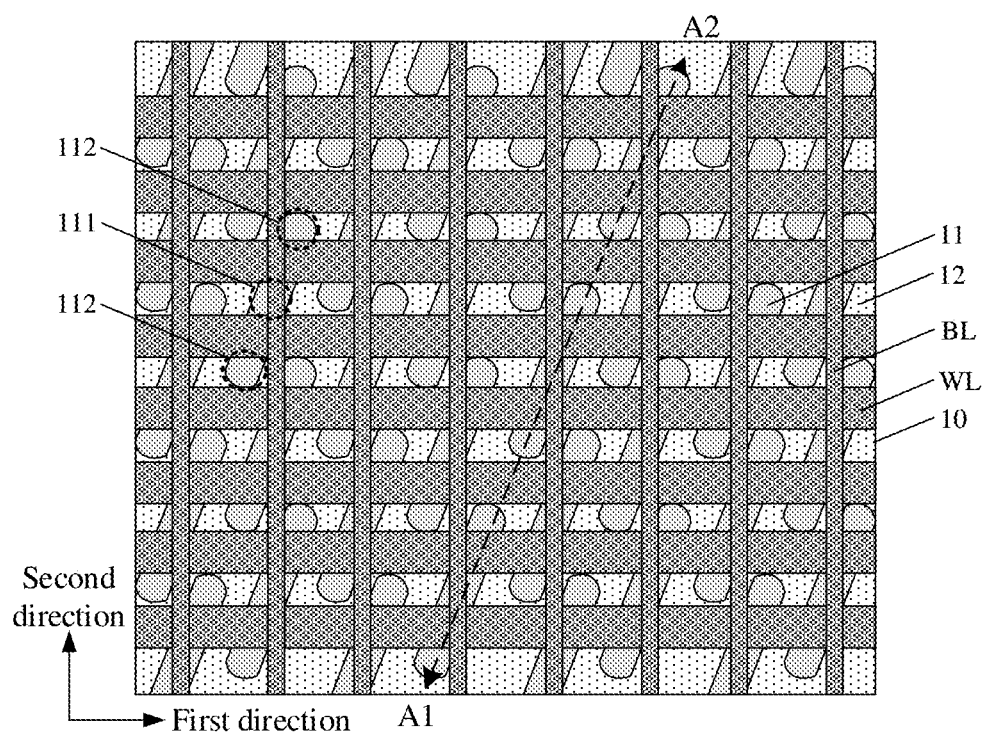
FIG. 2 is a schematic top view of a semiconductor structure according to an embodiment of the disclosure.
Figure 17:
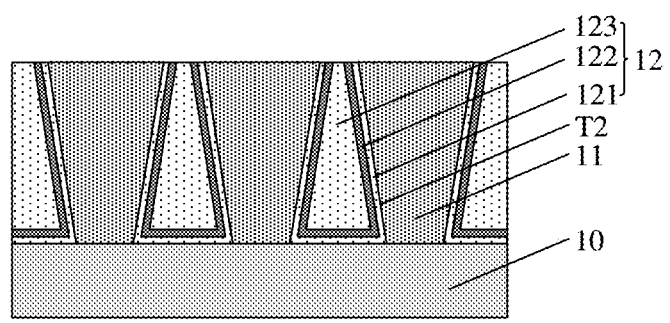
FIG. 17 is a schematic diagram of a cross-sectional structure, taken in the A1-A2 direction of FIG. 2, of operations of a method for fabricating a semiconductor structure according to another embodiment of the disclosure.
Figure 18:
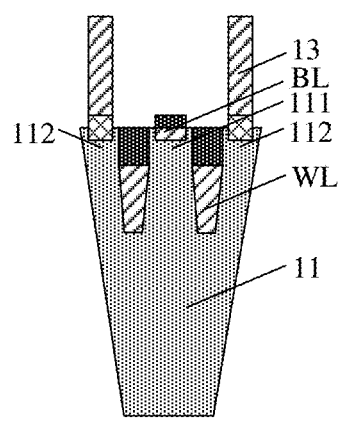
FIG. 18 is a schematic diagram of a local structure of a semiconductor structure according to an embodiment of the disclosure.
Figure 19:
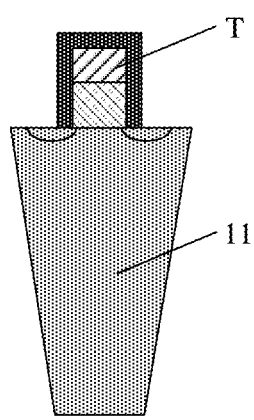
FIG. 19 is a schematic diagram of a local structure of another semiconductor structure according to an embodiment of the disclosure.

FIG. 1 is a block flowchart of a method for manufacturing a semiconductor structure according to an embodiment of the disclosure. FIG. 2 is a schematic top view of a semiconductor structure according to an embodiment of the disclosure. FIG. 3 to FIG. 13 are schematic diagrams of cross-sectional structures, taken in an A1-A2 direction of FIG. 2, of operations of a method for manufacturing a semiconductor structure according to an embodiment of the disclosure. FIG. 14 to FIG. 17 are schematic diagrams of cross-sectional structures, taken in the A1-A2 direction of FIG. 2, of operations of a method for manufacturing a semiconductor structure according to another embodiment of the disclosure. FIG. 18 is a schematic diagram of a local structure of a semiconductor structure according to an embodiment of the disclosure. FIG. 19 is a schematic diagram of a local structure of another semiconductor structure according to an embodiment of the disclosure.

The method for manufacturing a semiconductor structure provided in the embodiments of the disclosure is further described in detail below with reference to the drawings.

Figure 3:
FIG. 3 is a schematic diagram of a cross-sectional structure, taken in an A1-A2 direction of FIG. 2, of operations of a method for manufacturing a semiconductor structure according to an embodiment of the disclosure.

First, the operation S101 is executed, as shown in FIG. 3, the substrate 10 is provided.

Herein, the substrate may be a semiconductor substrate. A material of the semiconductor substrate includes an elemental semiconductor material (for example, a Silicon (Si) substrate, a Germanium (Ge) substrate), a III-V compound semiconductor material (for example, a Gallium Nitride (GaN) substrate, a Gallium Arsenide (GaAs) substrate, an Indium Phosphide (InP) substrate), a II-VI compound semiconductor material, an organic semiconductor material, or other semiconductor materials known in the art. In a specific embodiment, the substrate is the Si substrate.

Figure 4:
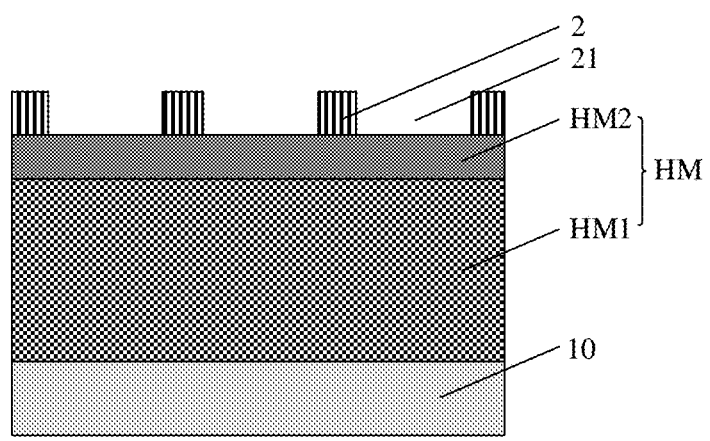
FIG. 4 is a schematic diagram of a cross-sectional structure, taken in an A1-A2 direction of FIG. 2, of operations of a method for fabricating a semiconductor structure according to an embodiment of the disclosure.
Figure 5:
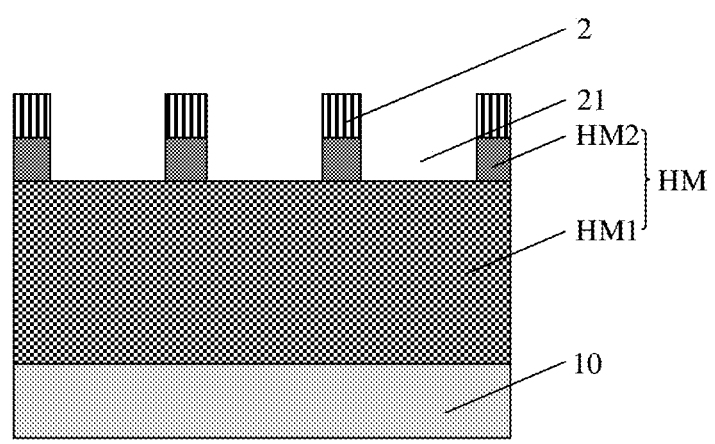
FIG. 5 is a schematic diagram of a cross-sectional structure, taken in an A1-A2 direction of FIG. 2, of operations of a method for fabricating a semiconductor structure according to an embodiment of the disclosure.
Figure 6:
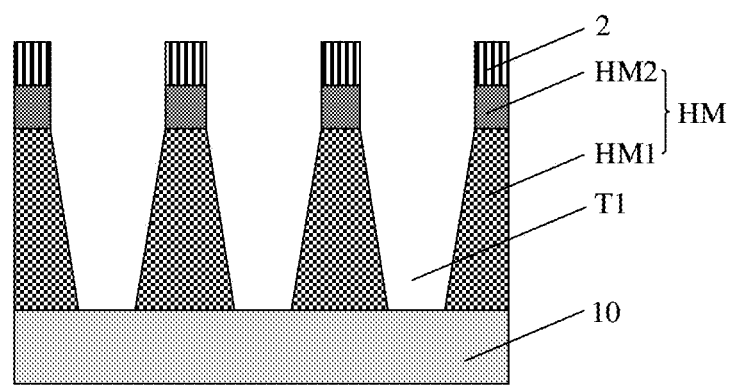
FIG. 6 is a schematic diagram of a cross-sectional structure, taken in an A1-A2 direction of FIG. 2, of operations of a method for fabricating a semiconductor structure according to an embodiment of the disclosure.

Next, the operation S102 is executed. As shown in FIG. 4, the mask layer HM is formed on the substrate 10.

In some embodiments, the operation that the mask layer HM is formed on the substrate 10 includes the following operations.

A first mask layer HM1 is formed on the substrate 10. The first mask layer HM1 covers an upper surface of the substrate 10.

A second mask layer HM2 is formed. The second mask layer HM2 covers an upper surface of the first mask layer HM1.

In an actual operation, a material of the first mask layer includes, but is not limited to, an insulation material, such as silicon oxide ($SiO_2$). A material of the second mask layer may also be the insulation material, such as silicon oxynitride (SiON), a spin-coated carbon (SOC) material, and the like. Herein, the second mask layer may be used as an anti-reflection layer.

It may be understood that, during performing a photolithography process, since a structure under photoresist generally has a high reflection coefficient, so that an exposure light source is easy to reflect on a surface of the structure under the photoresist, which results in the deformation of a photoresist pattern or size deviation (for example, a standing wave effect), thereby causing a pattern of a mask to not be correctly transferred.

In the embodiments of the disclosure, since the second mask layer may be used as an anti-reflection layer, the exposure light source is not easy to reflect on the surface of the structure under the photoresist during subsequent performing an etching process, to ensure correct transfer of an etching pattern.

In the actual process, the first mask layer and the second mask layer may be formed by one or more thin film deposition processes. Specifically, the thin film deposition processes include, but are not limited to, a Chemical Vapor Deposition (CVD) process, a Plasma Enhanced Chemical Vapor Deposition (PECVD) process, an Atomic Layer Deposition (ALD) process, or a combination thereof.

In some embodiments, when the material of the second mask layer is the SOC material, the second mask layer may also be obtained by a spin-coating process.

Next, the operation S103 is executed. As shown in FIG. 4 to FIG. 7, an etching process is performed to form the plurality of first trenches T1 in the mask layer HM. The first trench T1 has an inverted trapezoid cross-sectional shape.

In some embodiments, the operation that an etching process is performed to form the plurality of first trenches T1 in the mask layer HM includes the following operations.

A photoresist layer 2 is formed on the second mask layer HM2. The photoresist layer 2 includes a plurality of etching patterns 21.

The second mask layer HM2 is etched, to transfer the plurality of etching patterns 21 onto the second mask layer HM2.

The second mask layer HM2 is used as a mask to etch the first mask layer HM1, so as to form the plurality of first trenches T1 in the first mask layer HM1. The first trench T1 has an inverted trapezoid cross-sectional shape.

The photoresist layer 2 and the second mask layer HM2 are removed.

Herein, the first trench having the inverted trapezoid cross-sectional shape may be formed by controlling an etching parameter. For example, the first trench having the inverted trapezoid cross-sectional shape may be obtained by a dry etching process or a wet etching process having a longitudinal etching rate equal to a transverse etching rate. In addition, extra operations may not be required to the etching process in the method, so that the method has the characteristics of being simple and easy to implement.

The plurality of first trenches obtained by the above processes are mutually-independent. When active areas are formed on the basis of the first trenches subsequently, the formed active areas are also mutually independent.

Figure 7:
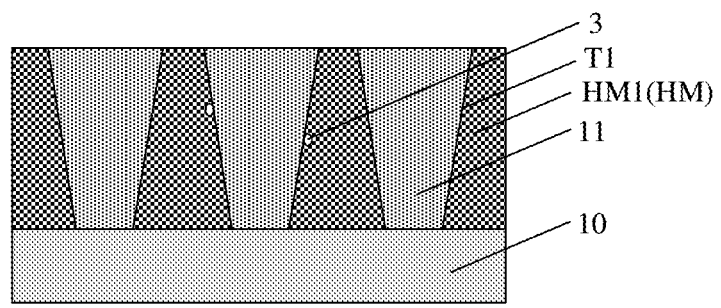
FIG. 7 is a schematic diagram of a cross-sectional structure, taken in an A1-A2 direction of FIG. 2, of operations of a method for fabricating a semiconductor structure according to an embodiment of the disclosure.

Then, the operation S104 is executed. As shown in FIG. 7, the epitaxy layer is formed on the substrate 10. The epitaxy layer is filled in each of the first trenches T1 to form an active area 11.

In some embodiments, a process for forming the epitaxy layer includes a molecular beam epitaxy process. The epitaxy layer has the same material and similar structure as the substrate 10. For example, the material of the epitaxy layer includes at least one of silicon, germanium, or silicon germanium.

Optionally, the epitaxy layer may be in at least one of a single-layer structure or a multilayer structure. In some embodiments, the epitaxy layer may be in the multilayer structure. The material of forming the epitaxy layer may include, but is not limited to, silicon, germanium, or silicon germanium.

In the actual operation, except a crystallization direction of the epitaxy layer which is the same as that of the substrate, other characteristics of the epitaxy layer, such as a material doping type and resistivity, may be selected according to actual situations. It may be understood that, in a case that the material of the epitaxy layer is the same as the material of the substrate, the semiconductor structure may have good performance.

Continuously referring to FIG. 7, it can be seen that, in some embodiments, after the epitaxy layer is formed, and before the mask layer HM is removed (before the following operation S105 is executed), a seam 3 is formed between the epitaxy layer and the mask layer HM.

Herein, in a process of forming the epitaxy layer on the substrate 10, since the epitaxy layer and the mask layer HM may be difference in material and crystallization direction or due to the impact of impurities or other adverse factors, it is difficult for the epitaxy layer to well cover a sidewall of the mask layer HM, so that the seam 3 (including but not limited to interspace, dislocation, and the like) is easily formed on an interface that the epitaxy layer is in contact with the mask layer HM. A current leakage path easily occurs due to the seam 3, resulting in reducing electrical performance or reliability of the semiconductor structure and increasing power consumption.

Therefore, although the material of the mask layer HM may isolate the active areas 11, the mask layer HM retained around the active area 11 in the actual operation is unsuitable to be directly used as an isolation structure due to the seam 3 after the operation of forming the epitaxy layer. Optionally, in some embodiments, the impact of the seam 3 on the performance of the semiconductor structure may be alleviated by performing a series of processing processes.

Figure 8:
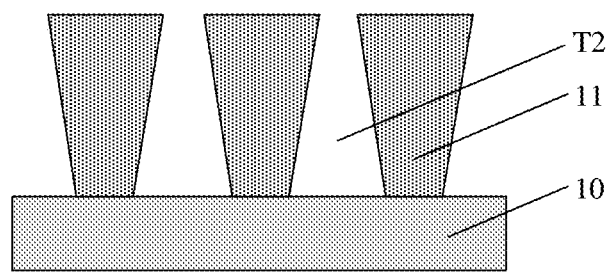
FIG. 8 is a schematic diagram of a cross-sectional structure, taken in an A1-A2 direction of FIG. 2, of operations of a method for fabricating a semiconductor structure according to an embodiment of the disclosure.
Figure 9:
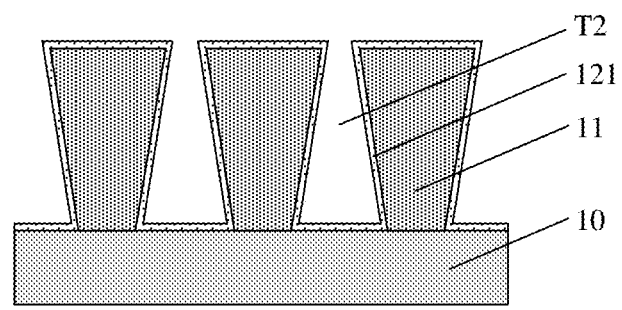
FIG. 9 is a schematic diagram of a cross-sectional structure, taken in an A1-A2 direction of FIG. 2, of operations of a method for fabricating a semiconductor structure according to an embodiment of the disclosure.
Figure 10:
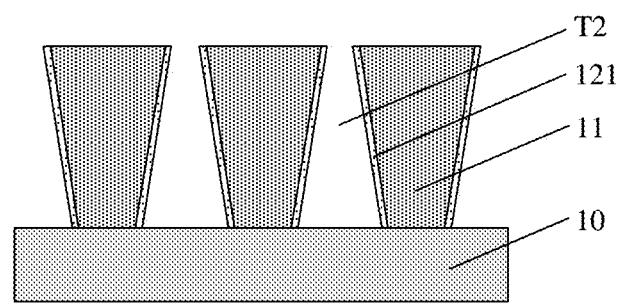
FIG. 10 is a schematic diagram of a cross-sectional structure, taken in an A1-A2 direction of FIG. 2, of operations of a method for fabricating a semiconductor structure according to an embodiment of the disclosure.
Figure 11:
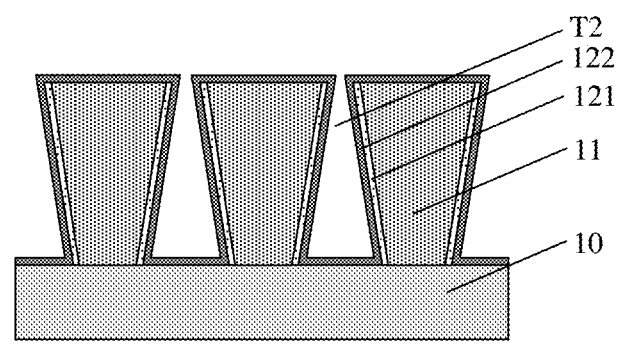
FIG. 11 is a schematic diagram of a cross-sectional structure, taken in an A1-A2 direction of FIG. 2, of operations of a method for fabricating a semiconductor structure according to an embodiment of the disclosure.
Figure 12:
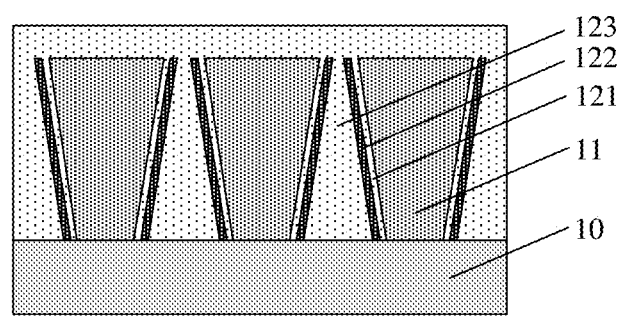
FIG. 12 is a schematic diagram of a cross-sectional structure, taken in an A1-A2 direction of FIG. 2, of operations of a method for fabricating a semiconductor structure according to an embodiment of the disclosure.

Next, the operation S105 is executed. As shown in FIG. 8, the mask layer HM is removed to form second trenches T2. The second trench T2 is arranged between the adjacent active areas 11. The second trench T2 has a regular trapezoid cross-sectional shape.

Herein, the seam 3 originally on the interface that the epitaxy layer is in contact with the mask layer HM may also be removed together while removing the mask layer HM. Therefore, the semiconductor structure can be effectively avoided from reducing electrical performance or reliability and increasing power consumption due to the seam 3, thereby providing necessary conditions for the semiconductor structure having desirable performance.

In some embodiments, the operation that the mask layer HM is removed to form the second trenches T2 includes the following operation.

The first mask layer HM1 is removed to form the second trenches T2. The second trench T2 is arranged between the adjacent active areas 11. The second trench T2 has the regular trapezoid cross-sectional shape.

Herein, the first mask layer HM1 may be removed by the wet etching process.

A selected wet etching solution may have a high etching selection ratio for the first mask layer HM1, to reduce the removal amount of the substrate 10 during the execution of the operation.

In the operation, the mask layer HM arranged between the active areas 11 is removed, and the second trench T2 obtained after the mask layer HM is removed has the regular trapezoid cross-sectional shape.

It may be understood that, since the second trench T2 has the regular trapezoid cross-sectional shape, a structure having an isolation function also obtains the same cross-sectional shape when a dielectric layer is subsequently filled in the second trench T2 to form the structure. Since a lower portion of the structure has a wide size, an isolation effect between the active areas 11 can be effectively improved, and the reliability of the semiconductor structure can be enhanced.

In addition, the seam 3 may be removed together in the operation of removing the mask layer HM to obtain the second trenches T2, so that an operator does not worry about the degradation of the performance of the finally-formed semiconductor structure caused by the seam 3. That is to say, according to the method provided in the embodiments of the disclosure, the electrical performance and reliability of the finally-formed semiconductor structure can be effectively improved, and power consumption can be reduced.

Finally, the operation S106 is executed. As shown in FIG. 9 to FIG. 13, FIG. 14 to FIG. 17, the dielectric layer is filled in the second trench T2 to form an isolation structure 12.

In some embodiments, as shown in FIG. 9 to FIG. 13, the operation of filling the dielectric layer in the second trench T2 to form the isolation structure 12 includes the following operations.

A first sub-layer 121 is filled in the second trench T2. The first sub-layer 121 covers sidewalls and bottom of the second trench T2 and covers an upper surface of the active area 11.

An etching process is performed, to remove portions of the first sub-layer 121 that are arranged at the bottom of the second trench T2 and the upper surface of the active areas 11.

A second sub-layer 122 is formed. The second sub-layer 122 covers sidewalls of the first sub-layer 121, the bottom of the second trench T2 and the upper surface of the active area 11.

An etching process is performed, to remove portions of the second sub-layer 122 that are arranged at the bottom of the second trench T2 and the upper surface of the active area 11.

A third sub-layer 123 is formed. The third sub-layer 123 is filled in the second trench T2 and covers the upper surface of the active area 11.

A planarization process is performed on the third sub-layer 123 to expose the active areas, to enable the upper surfaces of the active areas 11 are flush with an upper surface of a structure composed of the first sub-layer 121, the second sub-layer 122 and the third sub-layer 123.

Herein, the first sub-layer 121, the second sub-layer 122 and the third sub-layer 123 jointly form an isolation structure.

In some embodiments, the first sub-layer 121, the second sub-layer 122 and the third sub-layer 123 are all dielectric layers. For example, a material of the first sub-layer 121 may include silicon oxide, a material of the second sub-layer 122 may include silicon nitride, and a material of the third sub-layer 123 may include silicon oxide.

Optionally, in some embodiments, the silicon oxide of the third sub-layer may also be a silicon oxide material doped with carbon atoms. When the semiconductor structure includes an NMOS structure, the silicon oxide material arranged near the NMOS structure and doped with the carbon atoms may alleviate pressure stress of the third sub-layer to a channel structure in the NMOS structure, so as to improve carrier mobility. But the third sub-layer is not limited thereto, and the third sub-layer may also be an un-doped silicon oxide material in some embodiments.

It may be understood that, when the material of the first sub-layer includes the silicon oxide, a desirable contact interface may be formed with the active area, so that a favorable condition can be provided for the isolation effect of the isolation structure. When the material of the second sub-layer includes the silicon nitride, and since the silicon nitride is a stress material, the carrier mobility of the semiconductor structure can be increased by the second sub-layer. The third sub-layer facilitates forming the desirable contact interface between the isolation structure and the substrate, so as to enhance the isolation effect.

In some other embodiments, as shown in FIG. 14 to FIG. 17, the operation of filling the dielectric layer in the second trench T2 to form the isolation structure 12 includes the following operations.

A first sub-layer 121 is filled in the second trench T2. The first sub-layer 121 at least covers sidewalls and bottom of the second trench T2 and covers an upper surface of the active area 11.

The second sub-layer 122 is formed. The second sub-layer 122 is conformal to the first sub-layer 121.

The third sub-layer 123 is formed. The third sub-layer 123 is filled in the second trench T2 and covers the upper surface of the active area 11.

A planarization process is performed on the first sub-layer 121, the second sub-layer 122 and the third sub-layer 123 to expose the active area 11, to enable the upper surface of the active area 11 to be flush with an upper surface of a structure composed of the first sub-layer 121, the second sub-layer 122 and the third sub-layer 123.

Herein, the first sub-layer 121, the second sub-layer 122 and the third sub-layer 123 jointly form the isolation structure.

In some embodiments, the first sub-layer 121, the second sub-layer 122 and the third sub-layer 123 are all dielectric layers. For example, a material of the first sub-layer 121 may include silicon oxide, a material of the second sub-layer 122 may include silicon nitride, and a material of the third sub-layer 123 may include silicon oxide.

Optionally, in some embodiments, the silicon oxide of the third sub-layer may also be a silicon oxide material doped with carbon atoms. When the semiconductor structure includes an NMOS structure, the silicon oxide material arranged near the NMOS structure and doped with the carbon atoms may alleviate pressure stress of the third sub-layer onto a channel structure in the NMOS structure, to improve increase carrier mobility. But the third sub-layer is not limited thereto, and the third sub-layer may also be an un-doped silicon oxide material in some embodiments.

It may be understood that, when the material of the first sub-layer includes the silicon oxide, a desirable contact interface may be formed with the active area, so that a favorable condition can be provided for the isolation effect of the isolation structure. When the material of the second sub-layer includes the silicon nitride, and since the silicon nitride is a stress material, the carrier mobility of the semiconductor structure can be increased by the second sub-layer. The second trench is filled with the third sub-layer, to obtain the isolation structure with good stability.

In addition, in this embodiment, in addition to the sidewalls of the second trench, the second sub-layer also covers the bottom of the second trench. Therefore, compared with the above embodiment, the second sub-layer may further increase the carrier mobility of the semiconductor structure.

In any one of the above embodiments, a process for forming the first sub-layer includes at least one of a thermal oxidation process or a deposition process, and a process for forming the second sub-layer includes an atomic layer deposition process, and a process for forming the third sub-layer includes a spin-coating process.

So far, the process for manufacturing the semiconductor structure is completed, and the active area structures mutually independent and the isolation structure having good isolation effect are obtained.

It may be understood that, in a conventional process, the active area and the isolation structure are generally obtained by etching the substrate and filling a groove obtained by etching the substrate. In the method, since the integration level increases, the size of the active area and the distance between the active areas decrease accordingly. A challenge is proposed to the etching process due to the increasing aspect ratio in the process of etching the substrate to obtain the active area. The short circuit may occur between two active areas since the substrate between the two active areas is insufficiently etched, which severely affects the performance of the finally-formed semiconductor structure.

In the embodiments of the disclosure, rather than the active area is formed by etching the substrate, the active area having a large upper portion is obtained by forming the epitaxy layer in the trench after the trench having the inverted trapezoid cross-sectional shape is obtained by etching the mask layer. The active area may provide a large accommodating area for the structure to be formed subsequently thereon. Therefore, a good electric connection between the active area and the structure can be achieved, thereby avoiding poor contact. In addition, after the active area is formed, a material is formed to obtain the isolation structure, the desirable contact interface can be obtained in a position that the active area is in contact with the isolation structure, thereby enhancing the isolation effect, and effectively improving the performance of the semiconductor structure.

In addition, in the embodiments of the disclosure, the active area structure has an inverted trapezoid cross-sectional shape, and the isolation structure has a regular trapezoid cross-sectional shape. The shapes of the active area structure and the isolation structure can be complemented through the matching of the active area structure and the isolation structure. Therefore, the semiconductor structure can have the active area structure having a large upper portion without weakening the isolation effect of the isolation structure while not increasing the plane size of the substrate. When the semiconductor structure with high integration level and desirable performance is formed, the semiconductor structure may be implemented by the method of the embodiments of the disclosure.

Optionally, in some embodiments, when the active area 11 is arranged in a core area, as shown in FIG. 2 and FIG. 18, after the dielectric layer is filled in the second trench T2 to form the isolation structure 12, the method further includes the following operations.

A plurality of word lines WL extending in a first direction are formed on the substrate 10. The word lines WL pass through a plurality of active areas 11 and isolation structures 12 and are arranged between first source/drain regions 111 and second source/drain regions 112 of the active areas 11. The first direction is parallel to the surface of the substrate 10. The first source/drain region 111 is located in a middle area of the active area 11. The second source/drain region 112 is located at either end of the active area 11.

A plurality of bit lines BL extending in a second direction are formed on the substrate 10. The bit lines BL are connected to the first source/drain regions 111. The second direction is parallel to the surface of the substrate 10. The first direction is perpendicular to the second direction.

In some embodiments, as shown in FIG. 18, after the plurality of bit lines BL extending in the second direction are formed on the substrate 10, the method further includes the following operation.

A node contact plug 13 is formed. The node contact plug 13 is arranged on the second source/drain region 112.

Herein, since the upper portion of the active area has a large size, which has an enough area to accommodate the node contact plug formed thereon, so that the node contact plug may be disposed in a position having a large size from an edge of the active area. In this way, the occurrence of poor contact can be effectively prevented, thereby improving the electrical performance and reliability of the semiconductor structure.

Optionally, in some other embodiments, when the active area 11 is arranged in a peripheral area, as shown in FIG. 19, after the dielectric layer is filled in the second trench T2 to form the isolation structure 12, the method further includes the following operation.

A planar transistor structure T is formed on the active area 11.

Herein, the planar transistor structure T may include at least one of a PMOS structure or an NMOS structure. In some specific embodiments, the planar transistor structure T may simultaneously include the PMOS structure or the NMOS structure.

It may be understood that, since the upper portion of the active area has the large size, which has an enough area to accommodate the planar transistor structure formed thereon, so that the planar transistor structure may be disposed in a position having a large size from the edge of the active area. In this way, while guaranteeing normal functions of the planar transistor structure, the occurrence of poor contact can be effectively prevented, thereby improving the electrical performance and reliability of the finally-formed semiconductor structure.

The embodiments of the disclosure further provide a semiconductor structure. As shown in FIG. 2, FIG. 13, FIG. 17, FIG. 18 and FIG. 19, the semiconductor structure is manufactured by the method involved in any one of the above embodiments.

Rather than forming the active area by etching the substrate, in the embodiments of the disclosure, after the trench having the inverted trapezoid cross-sectional shape is obtained by etching the mask layer, the active area having a large upper portion is obtained by forming the epitaxy layer in the trench. The active area may provide a large accommodating area for the structure to be formed subsequently thereon. Therefore, a good electric connection between the active area and the structure can be formed, thereby avoiding poor contact. In addition, after the active area is formed, a material is formed to obtain the isolation structure, and the desirable contact interface can be obtained in a position that the active area is in contact with the isolation structure, thereby enhancing the isolation effect, and effectively improving the performance of the semiconductor structure.

In addition, in the embodiments of the disclosure, the active area structure has an inverted trapezoid cross-sectional shape, and the isolation structure has a regular trapezoid cross-sectional shape. The shapes of the active area structure and the isolation structure can be complemented through the matching of the active area structure and the isolation structure. Therefore, the semiconductor structure can have the active area structure having a large upper portion without weakening the isolation effect of the isolation structure while not increasing the plane size of the substrate. When the semiconductor structure with high integration level and desirable performance is formed, the semiconductor structure may be implemented by the method of the embodiments of the disclosure.

Figure 13:
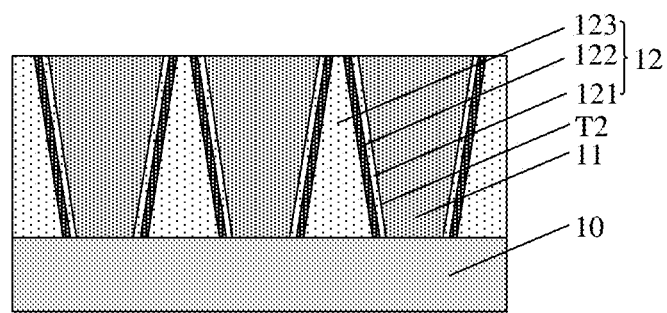
FIG. 13 is a schematic diagram of a cross-sectional structure, taken in an A1-A2 direction of FIG. 2, of operations of a method for fabricating a semiconductor structure according to an embodiment of the disclosure.
Figure 14:
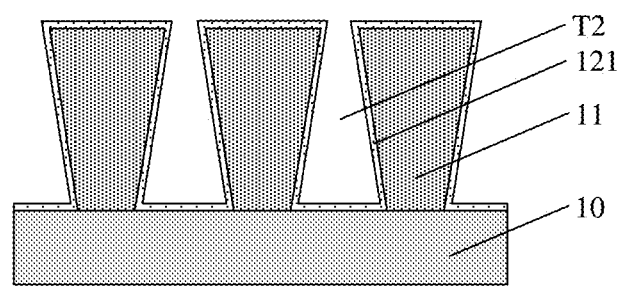
FIG. 14 is a schematic diagram of a cross-sectional structure, taken in the A1-A2 direction of FIG. 2, of operations of a method for manufacturing a semiconductor structure according to another embodiment of the disclosure.
Figure 15:
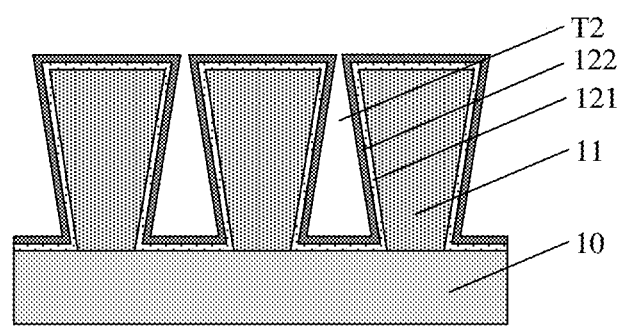
FIG. 15 is a schematic diagram of a cross-sectional structure, taken in the A1-A2 direction of FIG. 2, of operations of a method for fabricating a semiconductor structure according to another embodiment of the disclosure.
Figure 16:
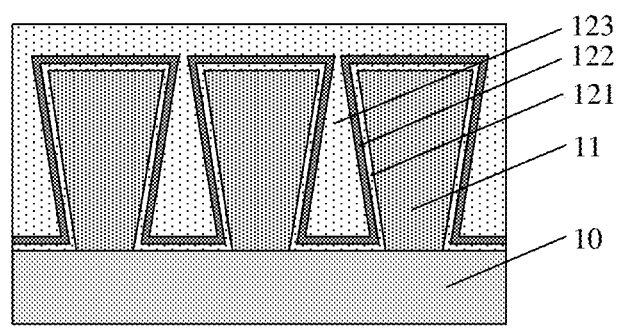
FIG. 16 is a schematic diagram of a cross-sectional structure, taken in the A1-A2 direction of FIG. 2, of operations of a method for fabricating a semiconductor structure according to another embodiment of the disclosure.

The embodiments of the disclosure further provide an isolation structure. As shown in FIG. 13 and FIG. 17, the isolation structure includes a substrate 10, a first sub-layer 121, a second sub-layer 122 and a third sub-layer 123.

The substrate 10 is provided with a second trench T2. The second trench T2 has a regular trapezoid cross-sectional shape.

The first sub-layer 121 is at least arranged on sidewalls of the second trench T2.

The second sub-layer 122 at least covers sidewalls of the first sub-layer 121.

The third sub-layer 123 at least covers sidewalls of the second sub-layer 122, and is filled in the second trench T2.

Herein, the first sub-layer 121, the second sub-layer 122 and the third sub-layer 123 jointly form the isolation structure.

In this embodiment of the disclosure, since the second trench has the regular trapezoid cross-sectional shape, the isolation structure arranged in the second trench also has a regular trapezoid cross-sectional shape. In this case, although an upper portion of the isolation structure is small, the isolation structure may maintain a strong isolation effect since the isolation structure has a large lower portion.

When another structure is disposed between the isolation structures, the isolation structure is designed to have the regular trapezoid cross-sectional shape, so that a favorable condition is provided for disposing another structure having a large upper portion between the isolation structures. The increasing of the size of the upper portion may effectively reduce the difficulty of performing the following processes on the structure, thereby ensuring successfully manufacturing the structure formed subsequently, and facilitating the obtaining of the structure with desirable performance.

That is, while the isolation structure provided in the embodiment of the disclosure has the strong isolation effect, the structure formed on the basis of another structure (a structure arranged between the isolation structures) may also be guaranteed to have desirable performance. When the semiconductor structure with high integration level and desirable performance is formed, the semiconductor structure can be implemented by the isolation structure of the embodiments of the disclosure.

Optionally, when another structure between the isolation structures is the active area, the active area can better accommodate a structure to be formed subsequently and form good contact with the structure.

In an actual operation, a relationship of the first sub-layer, the second sub-layer and the third sub-layer with the second trench may include a plurality of situations.

For example, in some embodiments of the disclosure, as shown in FIG. 13, the first sub-layer 121 and the second sub-layer 122 may only include portions arranged on the sidewalls of the second trench T2.

In some embodiments, the first sub-layer 121, the second sub-layer 122 and the third sub-layer 123 are all dielectric layers. For example, a material of the first sub-layer 121 may include silicon oxide; a material of the second sub-layer 122 may include silicon nitride; and a material of the third sub-layer 123 may include silicon oxide.

Optionally, in some embodiments, the silicon oxide of the third sub-layer may also be a silicon oxide material doped with carbon atoms. When the semiconductor structure includes an NMOS structure, the silicon oxide material arranged near the NMOS structure and doped with the carbon atoms may alleviate pressure stress of the third sub-layer onto a channel structure in the NMOS structure, to improve carrier mobility. But the third sub-layer is not limited thereto, and the third sub-layer may also be an un-doped silicon oxide material in some embodiments.

It may be understood that, when the material of the first sub-layer includes the silicon oxide, a desirable contact interface may be formed between the isolation structure and another structure isolated by the isolation structure, so that a favorable condition can be provided for the isolation effect of the isolation structure. When the material of the second sub-layer includes the silicon nitride, and since the silicon nitride is a stress material, the carrier mobility of the semiconductor structure can be improved by the second sub-layer. The third sub-layer facilitates forming the desirable contact interface between the isolation structure and the substrate, so as to enhance the isolation effect.

In some other embodiments of the disclosure, as shown in FIG. 17, the first sub-layer 121 covers sidewalls and bottom of the second trench T2, the second sub-layer 122 conformally covers the first sub-layer 121, and the third sub-layer 123 covers the sidewalls and bottom of the second sub-layer 122 and is filled in the second trench T2.

In some embodiments, the first sub-layer 121, the second sub-layer 122 and the third sub-layer 123 are all dielectric layers. For example, a material of the first sub-layer 121 may include silicon oxide, a material of the second sub-layer 122 may include silicon nitride, and a material of the third sub-layer 123 may include silicon oxide.

Optionally, in some embodiments, the silicon oxide of the third sub-layer may also be a silicon oxide material doped with carbon atoms. When the semiconductor structure includes an NMOS structure, the silicon oxide material arranged near the NMOS structure and doped with the carbon atoms may alleviate pressure stress of the third sub-layer onto a channel structure in the NMOS structure, to improve carrier mobility. But the third sub-layer is not limited thereto, and the third sub-layer may also be an undoped silicon oxide material in some embodiments.

It may be understood that, when the material of the first sub-layer includes the silicon oxide, a desirable contact interface may be formed between the isolation structure and another structure isolated by the isolation structure, so that a favorable condition can be provided for the isolation effect of the isolation structure. When the material of the second sub-layer includes the silicon nitride, and since the silicon nitride is a stress material, the carrier mobility of the semiconductor structure can be improved by the second sub-layer. Filling the second trench with the third sub-layer facilitates forming the isolation structure having good reliability.

In addition, in this embodiment, in addition to the sidewalls of the second trench, the second sub-layer also covers the bottom of the second trench. Therefore, compared with the above embodiment, the carrier mobility of the semiconductor structure may also be improved by the second sub-layer.

In any one of the above embodiments, a process for forming the first sub-layer includes at least one of a thermal oxidation process or a deposition process, a process for forming the second sub-layer includes an atomic layer deposition process, and a process for forming the third sub-layer includes a spin-coating process.

It is to be noted that, the method for manufacturing a semiconductor device provided in this embodiment of the disclosure is applicable to the DRAM structure or other semiconductor devices, which is not excessively limited herein. The embodiments of the method for manufacturing a semiconductor structure provided in the disclosure and the embodiments of the semiconductor structure and the isolation structure belong to the same concept. The technical features in the technical solutions described in the embodiments may be arbitrarily combined without conflict.

Only preferred embodiments of the disclosure is described above, and are not used to limit the scope of protection of the disclosure. Any modifications, equivalent substitution and improvements and the like made within the spirit and principle of the disclosure shall fall within the scope of protection of the disclosure.

What is claimed is:

1. A method for manufacturing a semiconductor structure, comprising:
   providing a substrate;
   forming a mask layer on the substrate;
   performing an etching process to form a plurality of first trenches in the mask layer, wherein each of the first trenches has an inverted trapezoid cross-sectional shape;
   forming an epitaxy layer on the substrate, wherein the epitaxy layer is filled in each of the first trenches to form an active area;
   removing the mask layer to form a plurality of second trenches, wherein each of the second trench is arranged between adjacent active areas, and each of the second trenches has a regular trapezoid cross-sectional shape; and
   filling a dielectric layer in each of the second trenches to form an isolation structure;
   wherein the forming a mask layer on the substrate comprises:
   forming a first mask layer on the substrate, wherein the first mask layer covers an upper surface of the substrate; and
   forming a second mask layer, wherein the second mask layer covers an upper surface of the first mask layer;
   wherein the performing an etching process to form a plurality of first trenches in the mask layer comprises:
   forming a photoresist layer on the second mask layer, wherein the photoresist layer comprises a plurality of etching patterns;
   etching the second mask layer, to transer the plurality of etching patterns to the second mask layer,
   etching the first mask layer by taking the second mask layer as a mask, to form the plurality of first trenches in the first mask layer; and
   removing the photoresist layer and the second mask layer;
   wherein the removing the mask layer to form a plurality of second trenches comprises:

removing the first mask layer to form the plurality of second trenches.

2. The method of claim 1, wherein a process for forming the epitaxy layer comprises a molecular beam epitaxy process; and a material of the epitaxy layer comprises at least one of silicon, germanium, or silicon germanium.

3. The method of claim 1, wherein after the epitaxy layer is formed and before the mask layer is removed, a seam exists between the epitaxy layer and the mask layer.

4. The method of claim 1, wherein the filling a dielectric layer in each of the second trenches to form an isolation structure comprises: for each of the second trenches,
 filling a first sub-layer in the second trench, wherein the first sub-layer covers sidewalls and bottom of the second trench and covers an upper surface of the active area;
 performing an etching process, to remove portions of the first sub-layer which are arranged at the bottom of the second trench and the upper surface of the active area;
 forming a second sub-layer, wherein the second sub-layer covers sidewalls of the first sub-layer, the bottom of the second trench and the upper surface of the active area;
 performing an etching process, to remove portions of the second sub-layer which are located at the bottom of the second trench and the upper surface of the active area;
 forming a third sub-layer, wherein the third sub-layer is filled in the second trench and covers the upper surface of the active area; and
 performing a planarization process on the third sub-layer to expose the active area, and to enable the upper surface of the active area to be flush with an upper surface of a structure composed of the first sub-layer, the second sub-layer and the third sub-layer.

5. The method of claim 4, wherein a process for forming the first sub-layer comprises at least one of a thermal oxidation process or a deposition process, a process for forming the second sub-layer comprises an atomic layer deposition process, and a process for forming the third sub-layer comprises a spin-coating process.

6. The method of claim 1, wherein the filling a dielectric layer in each of the second trenches to form an isolation structure comprises: for each of the second trenches,
 filling a first sub-layer in the second trench, wherein the first sub-layer at least covers sidewalls and bottom of the second trench and covers an upper surface of the active area;
 forming a second sub-layer, wherein the second sub-layer is conformal to the first sub-layer;
 forming a third sub-layer, wherein the third sub-layer is filled in the second trench and covers the upper surface of the active area; and
 performing a planarization process on the first sub-layer, the second sub-layer and the third sub-layer to expose the active area, and enable the upper surface of the active area to be flush with an upper surface of a structure composed of the first sub-layer, the second sub-layer and the third sub-layer.

7. The method of claim 6, wherein a process for forming the first sub-layer comprises at least one of a thermal oxidation process or a deposition process, a process for forming the second sub-layer comprises an atomic layer deposition process, and a process for forming the third sub-layer comprises a spin-coating process.

8. The method of claim 1, wherein the method further comprises: after the filling a dielectric layer in each of the second trenches to form an isolation structure,
 forming, on the substrate, a plurality of word lines extending in a first direction, wherein each of the word lines passes through the plurality of active areas and the plurality of isolation structures and is arranged between a first source/drain region and a second source/drain region of each of the plurality of active areas, the first direction is parallel a surface of the substrate, the first source/drain region is located in the middle of the active area, and the second source/drain region are located at either end of the active area; and
 forming, on the substrate, a plurality of bit lines extending in a second direction, wherein each of the bit lines is connected to the first source/drain region, the second direction is parallel to the surface of the substrate, and the first direction is perpendicular to the second direction.

9. The method of claim 8, wherein the method further comprises: after the forming, on the substrate, a plurality of bit lines extending in a second direction,
 forming a node contact plug arranged on the second source/drain region.

10. The method of claim 1, wherein the method further comprises: after the filling a dielectric layer in each of the second trenches to form an isolation structure,
 forming a planar transistor structure on the active area.

* * * * *